(12) United States Patent
Yamamoto et al.

(10) Patent No.: US 6,776,879 B2
(45) Date of Patent: Aug. 17, 2004

(54) BACKING PLATE USED FOR SPUTTERING APPARATUS AND SPUTTERING METHOD

(75) Inventors: Tatsushi Yamamoto, Nara (JP); Takamitsu Tadera, Tenri (JP)

(73) Assignee: Sharp Kabushiki Kaisha, Osaka (JP)

(*) Notice: Subject to any disclaimer, the term of this patent is extended or adjusted under 35 U.S.C. 154(b) by 0 days.

(21) Appl. No.: 10/058,341

(22) Filed: Jan. 28, 2002

(65) Prior Publication Data

US 2002/0100680 A1 Aug. 1, 2002

(30) Foreign Application Priority Data

Jan. 29, 2001 (JP) .................................... P2001-020532

(51) Int. Cl.[7] .............................................. C23C 14/34
(52) U.S. Cl. ........................... 204/192.12; 204/298.08
(58) Field of Search ....................... 204/192.12, 298.09, 204/298.12

(56) References Cited

U.S. PATENT DOCUMENTS 5,985,115 A * 11/1999 Hartsough et al. ..... 204/298.09
6,143,149 A * 11/2000 Abe ....................... 204/298.26
6,199,259 B1 * 3/2001 Demaray et al. ............. 29/458

OTHER PUBLICATIONS

JP 6172988 English Abstract.
2000-73164 English Abstract.
2000-248360 English Abstract.

* cited by examiner

Primary Examiner—Steven VerSteeg
(74) Attorney, Agent, or Firm—Edwards & Angell, LLP; David G. Conlin, Esq.; Richard J. Roos, Esq.

(57) ABSTRACT

It is an object of the invention to provide a backing plate used for the sputtering apparatus and a sputtering method which can improve film deposition rate and film quality without increasing the size of the target with respect to the substrate. High sputtering power is applied to a target portion opposite to a location where a thin film is formed on a surface of a substrate, thereby a thin film having even film thickness and film quality can be formed without increasing the size of the target. Further, a cooling medium flow passage can eliminate temperature unevenness caused by different sputtering powers to be applied to a target surface. The problem caused by the temperature rise can be solved and the film deposition speed can be enhanced by increasing the sputtering power which can be applied to the target. Consequently, it is possible to improve productivity of the substrate.

7 Claims, 12 Drawing Sheets

BACKING PLATE USED FOR SPUTTERING APPARATUS AND SPUTTERING METHOD

BACKGROUND OF THE INVENTION

1. Field of the Invention

The present invention relates to a backing plate and a sputtering method for fixing and cooling a target for sputtering which is used for a sputtering apparatus.

More particularly, the invention relates to a backing plate and a sputtering method, which are used for a sputtering apparatus in which a substrate having a large size of some hundreds of millimeters to 1 meter or more is coated with a thin film in a state that a substrate is not moved with respect to a target

2. Description of the Related Art

The sputtering apparatus is used to form a thin film on a surface of a substrate in steps of manufacturing semiconductor devices, electronic parts, liquid crystal panels and the like. More particularly, in liquid crystal panels and solar cell panels, a rectangular substrate to be formed with a thin film having a size of some hundreds of millimeters to 1 m or more is usually used.

The sputtering apparatus includes a film deposition chamber in which a substrate to be coated with a thin film and a base material of the thin film as a target are placed so as to be opposite to each other. The target is bonded to a backing plate. By applying a negative potential to the target by the backing plate, plasma is generated. Then, ions in plasma impinge onto the target, thereby sputtering particles are dispersed from the target. The sputtering particles emitted from the target are adhered to and deposited on the surface of the substrate. Finally, a thin film is formed on the substrate. Further, when ions in plasma collide with the target, the surface of the target is heated.

FIG. 6A is a plan view showing a conventional backing plate 104. FIG. 6B is a cross sectional view taken along the cross section line S5—S5 in FIG. 6A. The backing plate 104 is made of a metal such as copper or the like which is easily obtained and processed. Further, the backing plate 104 is formed so as to be mounted on the sputtering apparatus not shown in figure. The backing plate 104 provides the target 103 with a negative potential and also provided with a cooling means to prevent temperature increase.

When using the target 103 which is an inexpensive and easily processed material, it is possible to process the target 103 itself into the shape capable of being mounted on the sputtering apparatus. Further, it is possible to provide the cooling means for reducing excessive temperature increase due to collision of ions in plasma. However, in general, a thin-film material used for sputtering is required to be high purity, and the material is often expensive, for example, a ceramic which undergoes sintering, or has low heat-transfer. Accordingly, the target 103 in the actual use is formed in a simple planar shape. In addition to this, there are some cases that the target 103 has a circle figure, an oval figure, a rectangular figure, and small plates are combined with each other in a shape of tile so as to form the above mentioned figure.

The target 103 is bonded to the backing plate 104 by soldering (not shown) at the melting point of about 150° C. The backing plate 104 cools the target 103 by use of the cooling means to prevent excessive temperature increase of the target 103 and to prevent the target 103 from being peeled out from the backing plate 104 because the soldering is melted. Further, when the temperature of the target 103 excessively rises, in the extreme, the surface of the target 103 is melted or an arc discharge is generated due to the emission of thermal electrons from the heated portion, which causes local melting on the surface of the target 103. Because of this, cluster in a splay form, so-called "splash" is adhered on the substrate to be formed with a thin film, which becomes a factor that deteriorates the production yield in the sputtering step. Further, in consideration of the difference between the backing plate 104 and the target 103 in thermal expansion, the backing plate 104 can reduce thermal stress distortion when the target 103 is bonded to the backing plate 104.

The backing plate 104 is composed of two planar members 106a and 106b which are laminated each other in the direction of thickness. In the planar member 106a, one of the two planar members, continuous grooves in a stripe shape 107 are formed open to an opposed surface to the target bonding surface, and the planar member 106b, the other of the two planar members, is mated thereto to cover the grooves 107. According to this, the grooves 107 become a cooling water flow passage 105 in which cooling water flows. The cooling water flow passage 105 is provided with a cooling water inlet 108 and a cooling water exit 109 and has a configuration capable of circulation of the cooling water flown from the outside. By the circulation of the cooling water, not only the backing plate 104 but also the target 103 bonded to the backing plate 104 is cooled. For example, Japanese Unexamined Patent Publication JP-A 6-172988 (1994) discloses an example of the conventional backing plate 104.

FIG. 7A is a plan view showing another conventional backing plate 110. FIG. 7B is a cross sectional view taken along the cross section line S6—S6 in FIG. 7A. In the backing plate 110, several through holes 113 which penetrate the planar member 111 are bored in a lattice shape from a side surface of the planar member 111 by using a gun drill or the like. To compose the predetermined cooling water flow passage 105, the through holes 113 are covered with cap materials 112, and then the cap materials 112 and the planar member 111 are welded with a silver solder or the like.

FIG. 8 is a plan view showing still another conventional backing plate 115. The backing plate 115 has several cooling water flow passages 105 so as to be suitable for a large rectangular substrate 102a. Since the configuration of the backing plate 115 is much the same as the expansion of the backing plate 104 as shown in FIGS. 6A–6B, the same reference numerals are used ands detailed description will be omitted.

FIG. 9A is a perspective view showing another conventional backing plate 161. FIG. 9B is a bottom view of the backing plate 161 as shown in FIG. 9A. The backing plate 161 is composed of a base part 162 where a target 103 is bonded to the surface and a planar cooling part 163 having a cooling medium flow passage 166 at the inside. Further, the base part 162 and the cooling part 163 are made of aluminum. The cooling part 163 is integrally lined to the surface opposite to the target bonding surface of the base part 162 by welding (welding parts W1, W2). The cooling part 163 is composed of a roll bond panel 164 to be formed with a swelled tube part 165 on the entire surface, so that manufacturing process can be simplified. Such a conventional backing plate 161 is disclosed in Japanese Unexamined Patent Publication JP-A 2000-73164 (2000).

These disclosed techniques can obtain effects which conform respective object. However, when forming a large substrate such as a liquid crystal panel, a solar cell, and the like, there arises a problem described below in order to form a film at high speed in a state where the substrate and the target relatively remain at rest, and to control uniformity of film thickness and film quality of a thin film to be formed on a substrate to a desired range.

In general, the sputtering is carried out by using a target which is somewhat larger than a substrate to form a thin film having even film thickness and film quality on a substrate. Although the size of the target is determined depending upon the distance between the target and the substrate, it is generally determined based on the size about 1.1 times to 1.5 times as large as one side of the substrate as a guide. Further, recently, the size of the substrate to be formed has a side of about 1 m. As the size of the substrate becomes larger, target also becomes larger proportional to the size of the substrate. Consequently, the sputtering apparatus becomes large so that it has a large footprint in production lines, which causes a significant investment. Accordingly, it has been requested that not too large target with respect to the substrate size is used for sputtering.

Then, in a case where the size of the target is reduced, the film thickness at the periphery and the edge parts of the substrate becomes thin when applying a sputtering power to a surface of the target uniformly and it becomes difficult to form a uniform film on the surface of the substrate. Therefore, to form a uniform film on a substrate using a small target, the consumption of the target is intentionally accelerated at the periphery and edge parts of the target. More specifically, the plasma density is controlled at the sputtering to increase the density of emission of sputtering particles dispersed from the periphery of the target.

FIG. 10 and FIG. 11 show three-dimensional graphs illustrating the film thickness distribution obtained by executing a simulation using the direction and the density of sputtering particles discharged from the surface of the target. Numerical values of the horizontal axes in FIG. 10 and FIG. 11 show the distance from the center of each side of respective rectangular substrates. Namely, numerical values are shown with respect to an axis corresponding to an X-direction which is the long side of the substrate and an axis corresponding to a Y-direction which is the short side of the substrate. Also, vertical axis shows the film thickness distribution with respect to respective substrates.

A simulation is performed under the conditions that one side of the target is 1.5 times as long as that of the substrate; the distance between the target and the substrate is one fifth of the one side of the substrate; and the relationship between the emission direction and the emission density of the sputtering particles is based upon the law of cosine. FIG. 10 is a graph in a case where the target is evenly consumed and FIG. 11 is a graph in a case where the consumption of the target is intentionally accelerated at the periphery and the edge of the target, namely the emission density of sputtering particles is enhanced at the periphery and the edge parts. The film thickness distribution shows ±4.1% in FIG. 10 and ±0.7% in FIG. 11. It is found that the uniformity of film thickness is improved in a case where the emission density of sputtering particles is varied partially. To make the target further smaller, the emission density of sputtering particles is required to be further enhanced at the periphery and the edge parts of the target.

In such a manner, when different plasma densities are intentionally generated and the emission density of sputtering particles is partially altered to uniform film thickness and film quality of a thin film, the number of ions which impinge onto the target increases in the portion having high plasma density, and the temperature rises in contrast to the portion having low plasma density. At the time, there are some cases that the conventional backing plate cannot reduce the temperature increase to a sufficient degree at a portion having the distribution of high plasma density in a target surface. Namely, there may be cases where the target surface and also the bonding surface between the target and the backing plate have temperature unevenness.

FIGS. 12A and 12B and FIGS. 13A and 13B are schematic diagrams showing the state when applying a sputtering power to the target surface of the backing plate 115 shown in FIG. 8. FIGS. 12A–12B show the state in a case where a sputtering power is uniformly applied to the target surface and the cooling ability remains constant across the target surface, and FIGS. 13A–13B show the state in a case where the different sputtering powers are applied to the target surface and the cooling ability remains constant across the target surface. Moreover, in FIG. 12A and FIG. 13A, oblique lines indicate the ion current distribution and in FIG. 12B and FIG. 13B, oblique lines indicate the temperature distribution.

As shown in FIG. 12A and FIG. 12B, in a case where a sputtering power is applied to a region which contacts with a target 103 in a uniform distribution of electric power 131, constant temperature distribution 132 is obtained in the contacting region with the target 103, so that there is no significant difference in the temperature between the target surface and the bonding surface of the target 103 and the backing plate. Further, as shown in FIGS. 13A and 13B, when applying the different sputtering powers to the contacting region with the target 103, and more specifically, when applying a sputtering power which is higher than that of a central part of the target 144 to periphery parts 143 and 142 and applying a sputtering power which is higher than that of the periphery parts 143 and 142 to an edge part 141, the cooling ability remains constant across the target surface. Consequently, it is impossible to eliminate the temperature unevenness due to the difference in the sputtering power, which causes higher temperature of the periphery parts 153 and 152 than that of the central part 154 of the target 103 and higher temperature of the edge part 151 than that of the periphery parts 153 and 152. According to this, the target surface and the bonding surface between the target 103 and the backing plate 115 have the temperature differences. Therefore, to obtain even film thickness distribution, when sputtering is carried out in the distribution of sputtering power density as shown in FIG. 13A, the temperature of the periphery parts 153 and 152 and the edge part 151 increases, and the sputtering power which can be applied without problems with respect to the target 103 and the bonding surface between the target 103 and the backing plate, becomes small in total. Namely, high-speed film deposition can not be achieved properly.

In the recent magnetron sputtering technique, to improve the productivity, it is preferable to accelerate the film deposition speed for forming a thin film as fast as possible within the range capable of forming a thin film. This is because the processing capacity of the substrate is enhanced by reducing the time required for the film deposition. For this, the electric power to be supplied for causing a sputtering phenomenon is set to be as high as possible within the range where problems regarding film quality will not arise that soldering for bonding the target and the backing plate mentioned above will be melted or splash generates due to the heating of the target surface. Therefore, in a case where there is the temperature unevenness of the target surface and the bonding surface between the target and the backing plate, the highest temperature is required to be not higher than the melting point of soldering. In actual, to ensure the safety of apparatus operations, such conditions causing melting of soldering will not be set, however, it is desirable to improve the film deposition speed by applying higher electric power.

Namely, there is a tradeoff relationship between improvement in the film deposition speed by applying the electric power as high as possible to a large rectangular substrate and improvement in the film quality without problems. The conventional configuration to cool a bonding surface between the target and the backing plate uniformly and the sputtering method are inadequate to achieve this.

SUMMARY OF THE INVENTION

Accordingly, it is an object of the invention to provide a backing plate used for the sputtering apparatus and a sputtering method which can improve film deposition speed and film quality without increasing the size of the target with respect to the substrate.

The invention provides a backing plate which is used for a sputtering apparatus for forming a thin film on a substrate, and to which a target is bonded, the backing plate comprising:

cooling means for ensuring a uniform temperature distribution by eliminating temperature unevenness in a surface of the target caused by applying different sputtering powers to portions of the target to obtain a film having a uniform film thickness.

According to the invention, the temperature unevenness can be eliminated by the cooling means and the entire surface of the target can be uniformly cooled. Thus, peeling of the target from the backing plate and melting of the target due to the temperature rise can be prevented, thereby it is possible to increase the sputtering power which can be applied to the target. Also, by increasing the sputtering power to be applied, film deposition speed for forming the thin film can be accelerated and the productivity can be improved.

Further, in the case of forming a thin film on a large substrate, by applying high sputtering power to a target portion opposite to the location where a film having the thin thickness is formed on the surface of the substrate, quality of film deposition can be improved by uniforming the film thickness and film quality without increasing the size of the target. Also, the cooling means can reduce the temperature unevenness caused by the different sputtering powers to be applied to the surface of the target.

According to the invention, by ensuring a uniform distribution of temperature in the entire surface of the target, the amount of sputtering power to be applied to a large substrate is increased, the film deposition speed can be accelerated, and productivity can be improved without increasing the size of the target. By applying the different sputtering powers to the surface of the target, it is possible to uniform the film thickness and film quality of the thin film to be formed on the substrate and to control them to a desired range Consequently, a high-quality thin film can be formed in a short time.

In the invention, it is preferable that the cooling means includes a cooling medium flow passage having a branch for feeding the cooling medium to a periphery of the backing plate and a flow rate of the cooling medium is controlled so as to obtain almost uniform distribution of temperature in the target.

According to the invention, since includes a cooling medium flow passage having a branch for feeding the cooling medium to a periphery of the backing plate and controls the flow rate of the cooling medium, the target can be cooled in accordance with the temperature distribution of the target, thereby it is possible to cool the whole of the target at a uniform temperature. Then, since the cooling medium flow passage branches off on its way, in the case of reducing a number of a cooling medium flow inlet and a cooling medium flow outlet, for example, in the case of the cooling medium flow passage having one channel, different cooling abilities can be provided in a bonding surface with the target. Further, the cooling medium is flown through the periphery of the backing plate, so that the periphery of the backing plate can be cooled. Therefore, when the high sputtering power is applied, the periphery of the target, which has a higher temperature than a central portion of the target, can be cooled effectively.

According to the invention, the cooling medium flow passage branches off and controls the flow rate of the cooling medium. Therefore, it is possible to design the cooling medium flow passage having high cooling ability with a few flow inlet and flow outlet based on the symmetry in a shape of the target. Consequently, the target can be effectively cooled. Further, since numbers of the flow inlet and the flow outlet are small, numbers of processes can be reduced when an actual operation for changing the target is performed. Also, since the periphery of the backing plate can be cooled, it is possible to more effectively uniform temperature distribution in the entire surface of the target.

In the invention, it is preferable that the backing plate is formed by electron beam welding of a member having a groove as a cooling medium flow passage and a member for covering the grooves.

In the invention, it is preferable that the backing plate is formed by laser beam welding of a member having a groove as a cooling medium flow passage and a member for covering the grooves.

According to the invention, since the backing plate is formed by welding of a member having a groove as a cooling medium flow passage and a member for covering the grooves, it is possible to use a width and a height of the cooling medium flow passage as design parameters when the conductance of the cooling medium flow passage is adjusted, thereby it is possible to increase a range of the adjustment. Moreover, since the welding using the heat source having high energy, such as the electron beam welding or the laser beam welding, is carried out, the whole of the backing plate is prevented from being heated to high temperature at welding. Accordingly, the backing plate can be used in keeping a high mechanical strength. Further, since welding is carried out at high speed, the backing plate can be formed in a short time.

In the invention, it is preferable that the target is formed in a rectangular plate shape and a higher sputtering power than that applied to a central portion of the target is applied to four corner portions of the target.

According to the invention, since the higher sputtering power than that applied to the central portion of the target is applied to the four corner portions of the target, a plasma density to be formed in the four corner portions increases in comparison with the central portion, thereby it is possible to increase sputtering particles which is emitted from the four corner portions to the substrate. Accordingly, a thin film having uniform thickness can be formed on the surface of the substrate without upsizing the target with respect to the substrate.

According to the invention, since the higher sputtering power than that applied to the central portion of the target is applied to the four corner portions of the target, sputtering particles which is emitted from the four corner portions to the substrate, can be increased. Accordingly, a thin film having a uniform thickness can be formed On the surface of the substrate without using larger target with respect to the substrate.

In the invention, it is preferable that an inlet of the cooling medium flow passage is provided at a position in the backing plate which position corresponds to at least one of the four corner portions of the target.

According to the invention, since the inlet of the cooling medium flow passage is provided at the position in the backing plate which position corresponds to at least one of the four corner portions of the target, the four corner portions can be cooled reliably by flowing the cooling medium having the lowest temperature to the location corresponding to the four corner portions where the temperature becomes the highest in the target.

According to the invention, since the inlet of the cooling medium flow passage is provided at the position in the backing plate which position corresponds to at least one of the four corner portions of the target, the four corner portions can be cooled reliably, and a uniform distribution of temperature in the surface of the target is further ensured.

The invention provides a sputtering method for forming a thin film on a substrate using a target, the method comprising the steps of:

applying different sputtering powers to portions of the target to obtain a film having a uniform film thickness; and cooling the target to ensure a uniform temperature distribution by eliminating temperature unevenness in a surface of the target caused by applying the different sputtering powers to the portions of the target, According to the invention, a plasma density can be partially controlled and an emission density of sputtering particles can be partially changed by applying the different sputtering powers. Thus, it is possible to form the thin film to be formed on the substrate at the uniform thickness. Further, the target is cooled based upon the temperature unevenness in the surface of the target, thereby the entire surface of the target can be cooled uniformly. Accordingly, peeling of the target and the backing plate and the melting of the target due to the temperature rise can be prevented and the sputtering power which can be applied to the target can be increased. By elevating the sputtering power, the amount of sputtering power can be increased, the deposition speed for forming the thin film can be accelerated and the productivity can be improved.

According to the invention, by controlling the plasma density partially, the thin film is formed on the substrate at the uniform thickness. At the time, the target is cooled based upon the temperature unevenness in the surface of the target, thereby the entire surface of the target can be cooled uniformly, Accordingly, peeling of the target and the backing plate and the melting of the target due to the temperature rise can be prevented and the sputtering power which can be applied to the target can be increased. By elevating the sputtering power, the amount of sputtering power can be increased, the deposition speed for forming the thin film can be accelerated and the productivity can be improved.

BRIEF DESCRIPTION OF THE DRAWINGS

Other and further objects, features, and advantages of the invention will be more explicit from the following detailed description taken with reference to the drawings wherein:

FIG. 3A is a plan view and

FIG. 3B is a cross sectional view;

FIG. 4A is a plan view showing the power distribution and FIG. 4B is a plan view showing the temperature distribution;

FIG. 6A is a plan view and FIG. 6B is a cross sectional view taken along a cross sectional line S5—S5 in FIG. 6A;

FIG. 7A is a plan view and FIG. 7B is a cross sectional view taken along a cross sectional line S6—S6 in FIG. 7A;

FIG. 9A is a perspective view and FIG. 9B is a bottom view of the backing plate shown in FIG. 9A;

FIG. 12A is a plan view showing an ion current distribution indicated by oblique lines and FIG. 12B is a plan view showing a temperature distribution indicated by oblique lines; FIG. 13A is a plan view showing a current distribution indicated by oblique lines and FIG. 13B is a plan view showing a temperature distribution indicated by oblique lines.

DETAILED DESCRIPTION OF THE PREFERRED EMBODIMENTS

Figure 1:
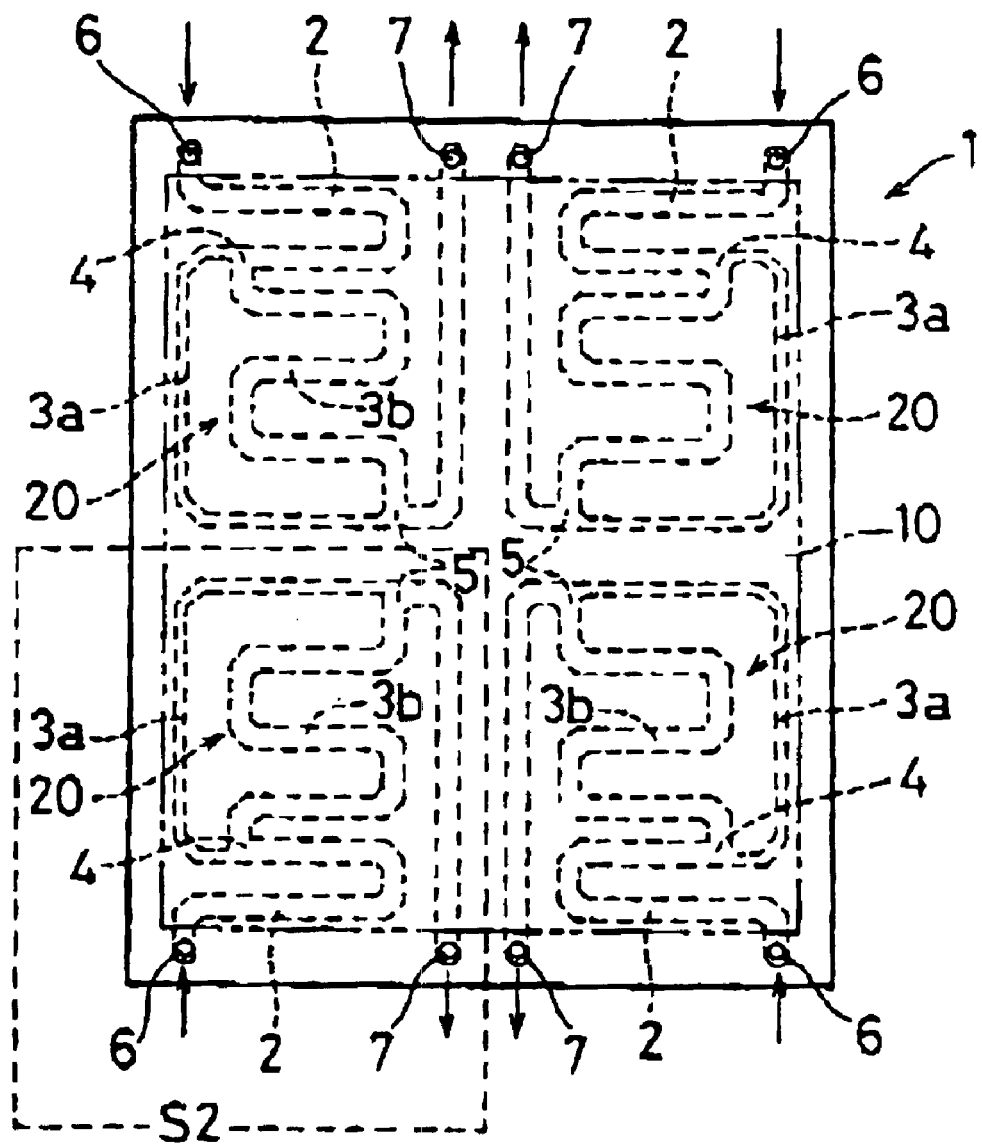
FIG. 1 is a plan view showing a backing plate according to one embodiment of the invention.

Now referring to the drawings, preferred embodiments of the invention are described below.

Figure 2:
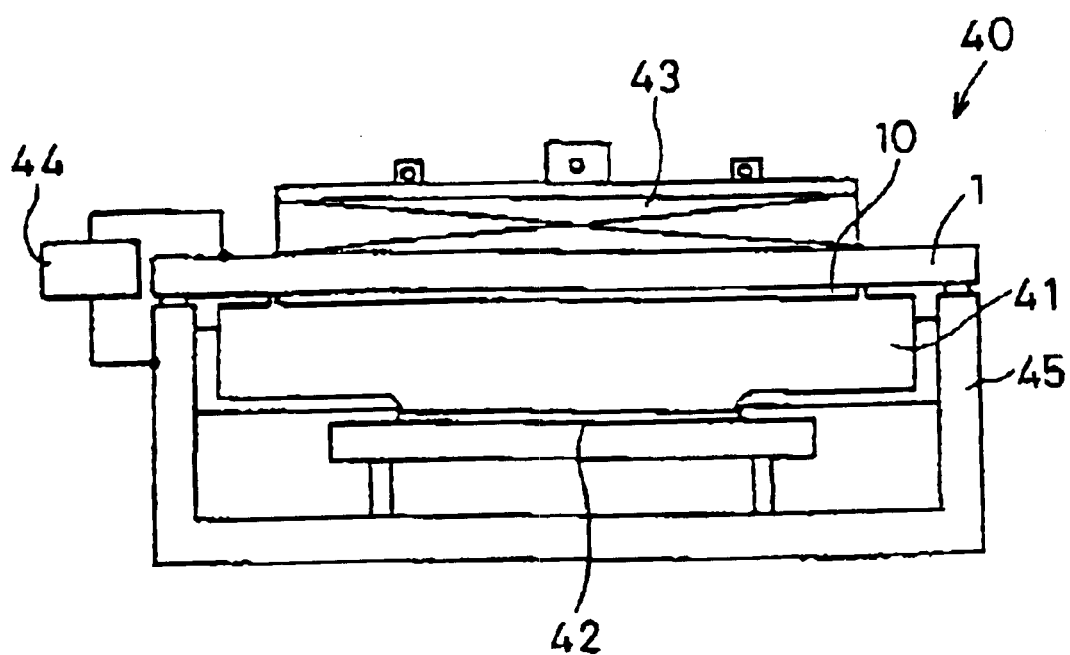
FIG. 2 is a front view showing a sputtering apparatus on which the backing plate is mounted according to one embodiment of the invention.

FIG. 1 is a plan view showing a backing plate 1 according to one embodiment of the invention and FIG. 2 is a front view showing a sputtering apparatus 40 on which a backing plate 1 is mounted according to one embodiment of the invention. The backing plate 1 is used for the sputtering apparatus 40 so as to form a thin film on a substrate. The sputtering apparatus 40 includes a film deposition chamber 41 as a vacuum chamber in which a substrate 42 to be covered with a thin film and a target 10 as a base material of a thin film are placed opposite to each other.

The target 10 is bonded to the backing plate 1, which is cooled by cooling medium such as cooling water supplied from the cooling medium supplying source (not shown), by metal having a low melting point such as indium (soldering) (not shown). Temperature rise due to impingement of ions at sputtering can be controlled by the backing plate 1. The backing plate 1 is mounted on a base member 45 which constitutes a part of the wall surrounding the film deposition chamber 41.

Then, a rear surface of the backing plate 1 is provided with a magnetic circuit 43 so as to generate a poloidal magnetic field in a tunnel shape on a surface of the target 10.

In a state where tunnel-shaped poloidal magnetic field is generated by the magnetic circuit 43, when a negative potential is applied to the target 10 through a power source 44, the surface of the target 10 is struck by ions generated in a plasma. At this time, since secondary electrons emitted by γ effect are captured by the poloidal magnetic field, a high-density plasma having a loop shape is produced along the tunnel shaped poloidal magnetic field (hereinafter, referred to as a racetrack shape).

Ions in the high-density plasma mentioned above are accelerated toward the target 10 by an ion sheath electric field generated in proximity of the surface of the target 10, and impinge onto the target 10, thereby a substance constituting the target 10 is scattered. At the same time, secondary electrons are emitted from the surface of the target 10 by the γ effect.

Then, particles scattered from the surface of the target 10 is adhered and deposited on the surface of the substrate 42 opposed to the target 10, thereby a thin film is formed.

According to the sputtering apparatus 40, a racetrack-shape high-density plasma can be locally generated, so that the film deposition can be carried out at high speed and the temperature rise of the substrate can be controlled.

As mentioned above, the target 10 is bonded to the backing plate 1 by means of e.g. indium soldering having a melting point of about 150° C. A power source 44, which is sputtering power supplying means for applying a sputtering power to the target 10, is connected to the backing plate 1. The backing plate 1 has cooling means 20 for cooling the target 10. According to the embodiment, the cooling means is formed by a cooling medium flow passage 2 in which cooling medium circulates. Then, the backing plate 1 is provided with the cooling medium flow passage 2 having independent four channels.

Figure 3A:
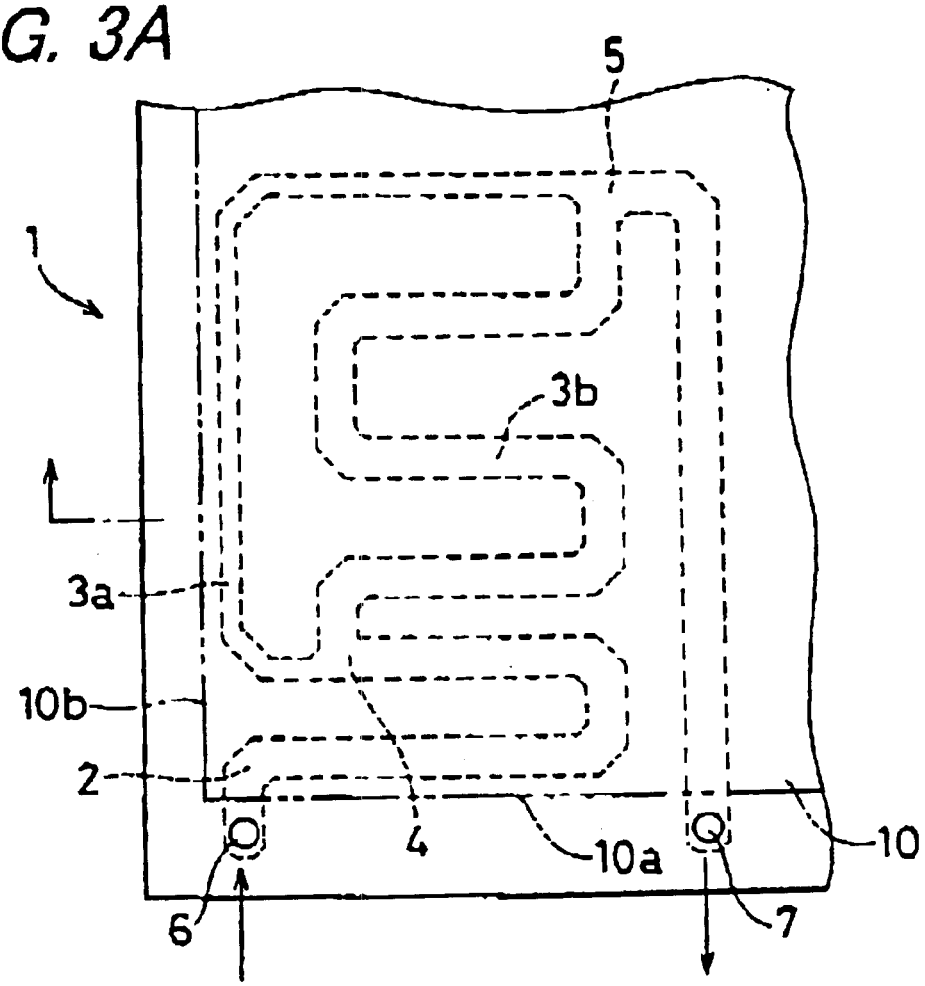
FIGS. 3A and 3B are enlarged views showing a section S2 shown in FIG. 1 which is a part of the backing plate.
Figure 3B:
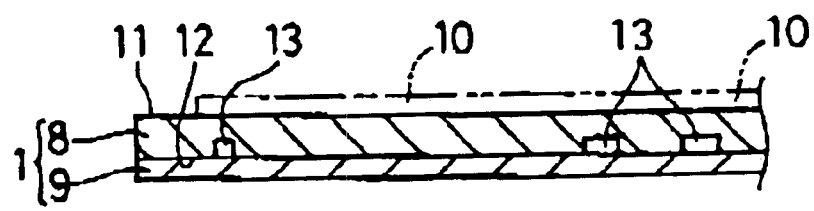
Figure 7A:
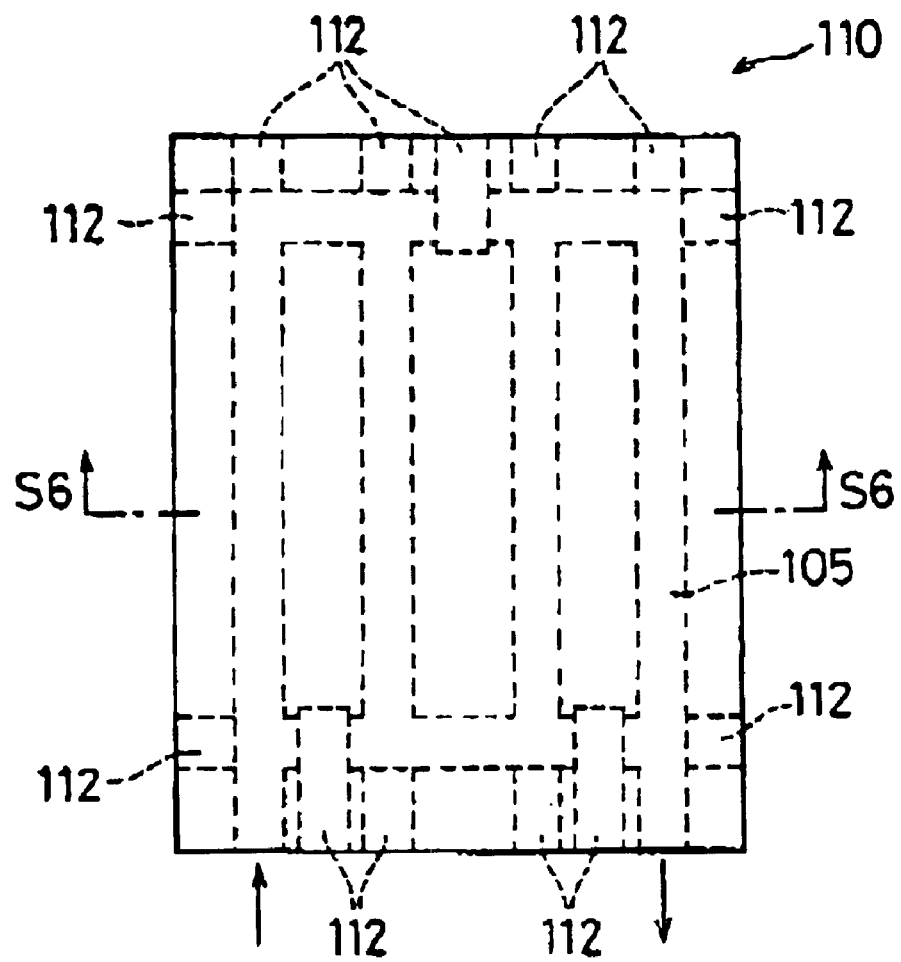
FIGS. 7A and 7B are views showing another conventional backing plate.
Figure 7B:
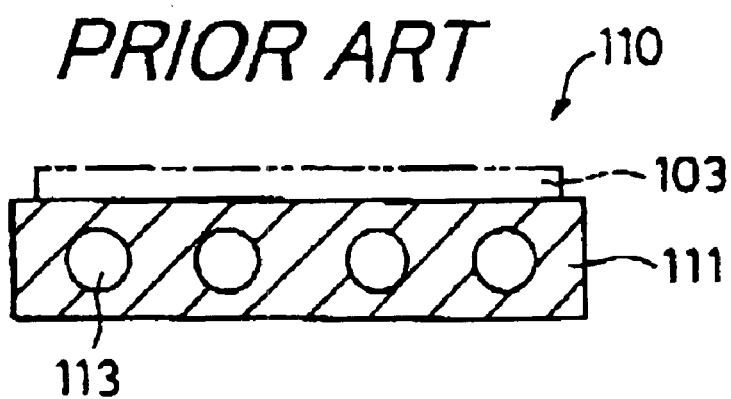
Figure 8:
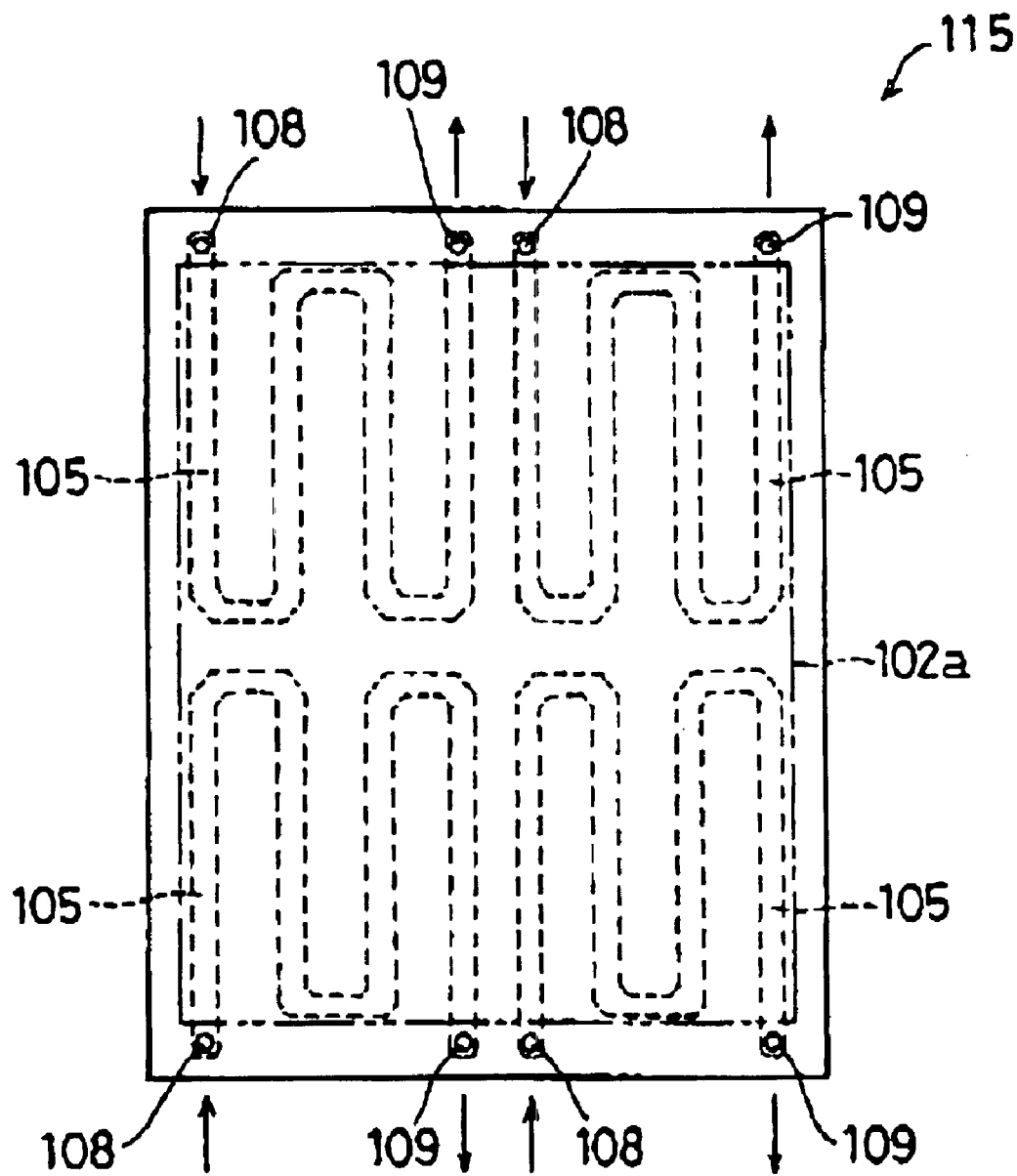
FIG. 8 is a plan view showing still another conventional backing plate.
Figure 9A:
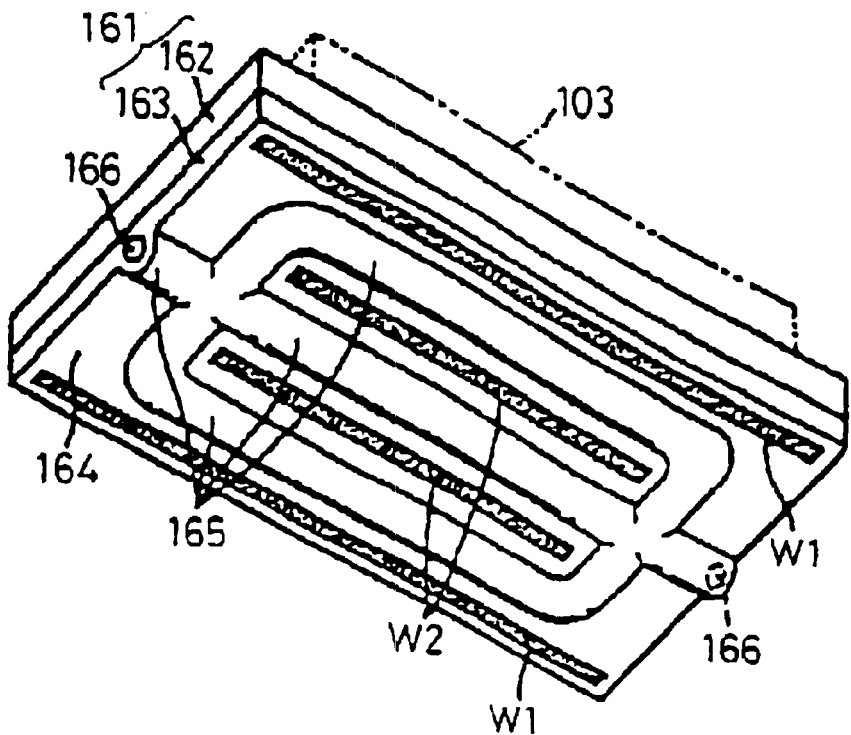
FIGS. 9A and 9B are views showing still another conventional backing plate.
Figure 9B:
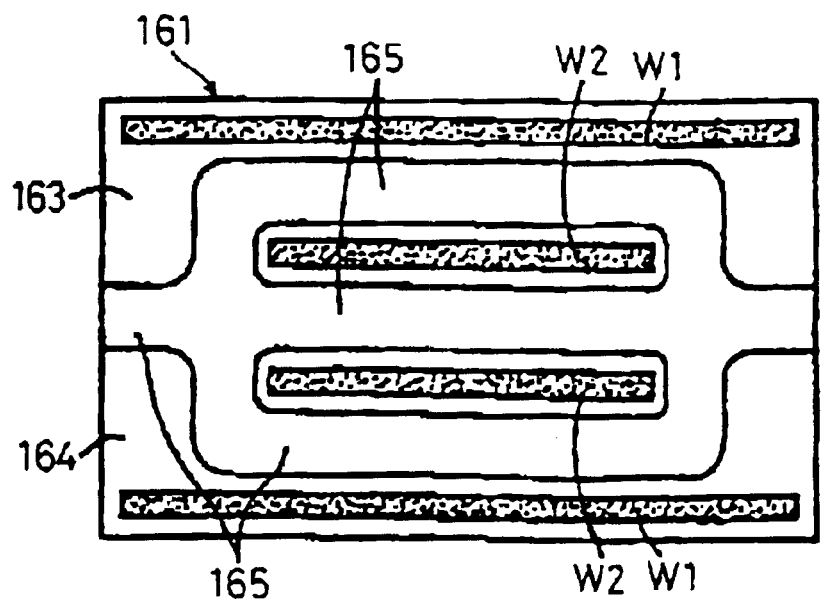
Figure 10:
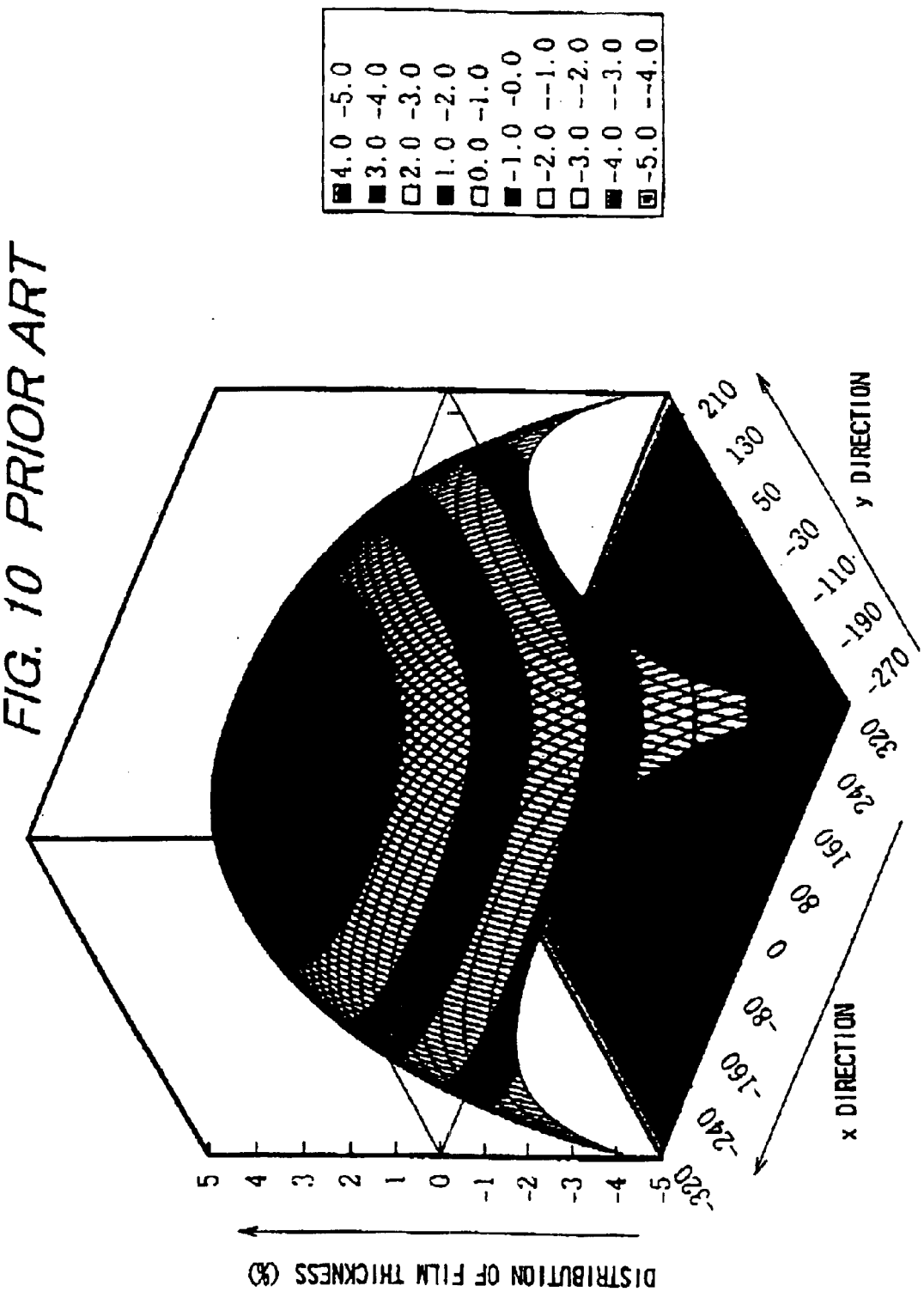
FIG. 10 is a three-dimensional graph illustrating a film thickness distribution obtained by executing a simulation using a direction and a density of sputtering particles emitted from the surface of the target in the case where the target is evenly consumed.
Figure 11:
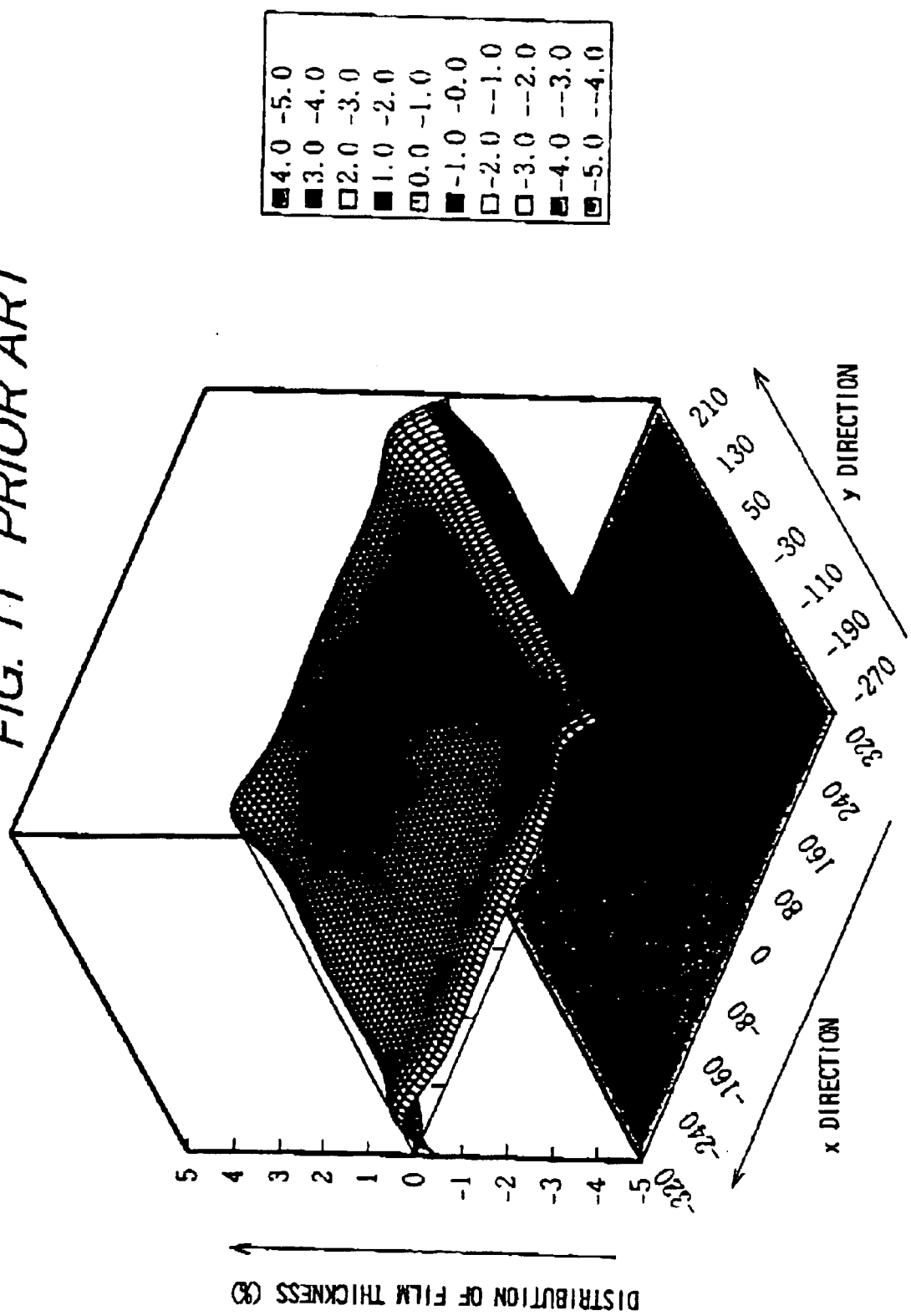
FIG. 11 is a three-dimensional graph illustrating a film thickness distribution obtained by executing a simulation using a direction and a density of sputtering particles emitted from the surface of the target in the case where the consumption of the target is intentionally enhanced at a periphery and corner portions of the target.
Figure 12A:
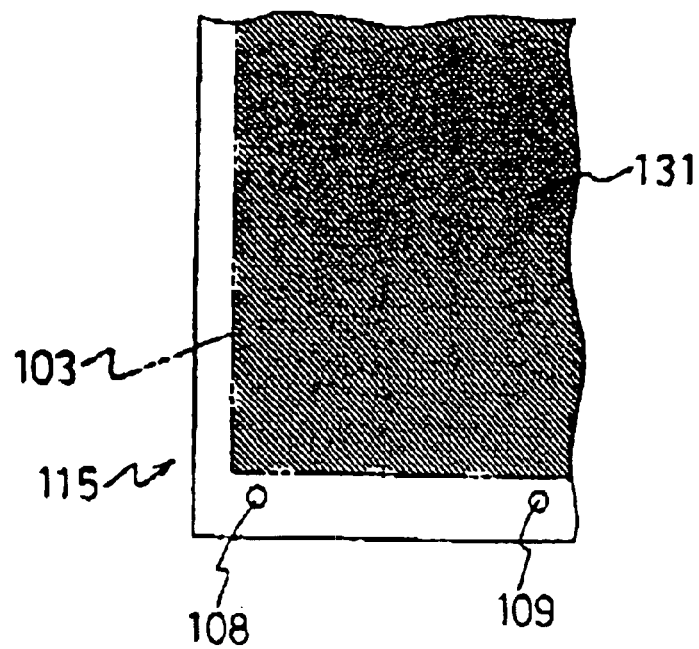
FIGS. 12A and 12B are schematic views showing the backing plate when a uniform sputtering power is applied to the target surface and cooling ability is constant in the surface of the target.
Figure 12B:
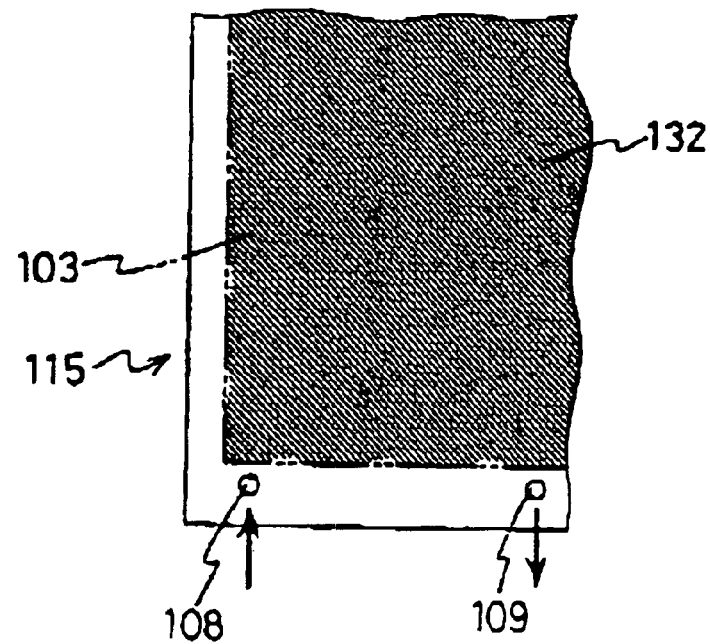
Figure 13A:
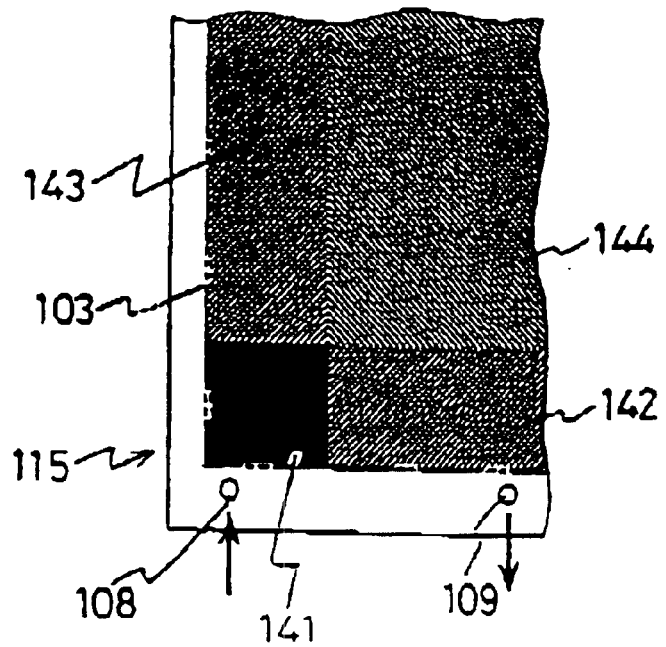
FIGS. 13A and 13B are schematic views showing the backing plate when different sputtering powers are applied to the target surface and cooling ability is constant in the surface of the target.
Figure 13B:
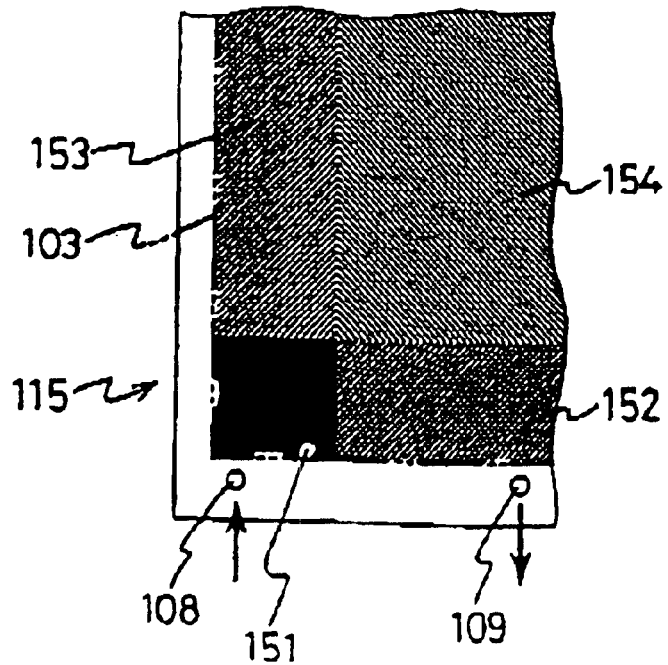

FIGS. 3A and 3B are enlarged views showing a section S2 in FIG. 1 which is a part of the backing plate 1: FIG. 3A is a plan view and FIG. 3B is a cross sectional view. The backing plate 1 comprises a planar cooling medium flow passage formation plate 8 and a planar sealing plate 9. The two planar members 8 and 9 are laminated on each other in a thickness direction of them. The target 10 is come into contact with one surface 11 of the cooling medium flow passage formation plate 8 in the thickness direction, and grooves 13 are formed open toward a side of another surface 12 of the cooling medium flow passage formation plate 8 in the thickness direction. The sealing plate 9 is joined to the cooling medium flow passage formation plate 8 to cover the grooves 13, The space formed by three surfaces forming the grooves 13 and a surface of the sealing plate 9 facing the grooves 13, is defined as the cooling medium flow passage 2. Cooling medium flows through the cooling medium flow passage 2. The grooves 13 are formed open toward the side of another surface 12 of the cooling medium flow passage formation plate 8 in the thickness direction, so that complicated width, depth and path can be easily formed in comparison with the conventional cooling medium flow passage, for example, the cooling medium flow passage formed by means of the gun drill as shown in FIGS. 7A and 7B, and the cooling medium flow passage formed in the roll bond panel as shown in FIGS. 9A and 9B.

The cooling medium flow passage formation plate 8 and the sealing plate 9 are joined by welding utilizing a heat source having high energy such as an electron beam welding, a laser beam welding, or the like. Thereby, it is possible to prevent the whole of backing plate 1 from being heated to high temperature at the time of welding, and to join the cooling medium flow passage formation plate and the sealing plate without reducing a mechanical strength. Consequently, it is possible to form the backing plate 1 having small warp due to thermal expansion and precise shape.

Further, the backing plate 1 is provided with an opening (not shown) for mounting on a base 45 of the sputtering apparatus 40 in an outer region of a target bonding region. Moreover, the backing plate 1 is mounted on the base 45 of the sputtering apparatus 40, thereby the backing plate 1 constitutes the one of the wall surrounding the film deposition chamber 41 in the sputtering apparatus 40.

The backing plate 1 is usually made of a material having good thermal conductivity, such as copper or aluminum allay. In order to match a coefficient of thermal expansion of the target 10 with that of the backing plate, and in order to withstand a fluid pressure and an atmospheric pressure at the circulation of the cooling medium, materials, shape, and strength are determined in accordance with each case.

The sputtering power in a target surface is usually controlled by increasing or decreasing the magnetron magnetic field for converging the plasma. Most of industrial sputtering apparatuses are provided with magnetic field generating means such as the magnetic circuit 43, for generating a magnetron magnetic field on the target surface, close to the rear surface of the backing plate 1 (opposite to the target 10). By controlling a magnetic circuit design of the magnetic field generating means and a geometric arrangement between the backing plate 1 and the magnetic field generating means, in addition, by controlling the intensity and the distribution of magnetic field which is generated on the target surface, it is possible to apply the different sputtering powers to the target 10 so as to obtain a uniform plasma density and form a thin film having a uniform film thickness on a substrate. More specifically, in the case where the size of the target 10 is not extremely large in comparison with the substrate, for example, in the case of using the rectangular target 10 having about 1.1 times to 1.5 times larger side than the rectangular substrate, higher electric power than that of a central portion of the target 10, is applied to a periphery portion of the target 10 and higher electric power than that of the peripheral portion is applied to four corner portions of the target 10. Consequently, a thin film having a uniform thickness can be formed.

Further, the cooling medium flow passage 2 is formed so as to reduce a temperature unevenness and uniform a temperature distribution in the target surface. The cooling medium flow passage 2 circulates cooling medium such as water through the backing plate so as to cool the backing plate 1 as well as the target 10 bonded to the backing plate 1. The cooling medium flows into the cooling medium flow passage 2 from the outside of the backing plate 1 via a cooling medium inlet 6 and flows to the outside of the backing plate 1 via a cooling medium outlet 7.

According to the embodiment of the invention, the cooling medium flow passage 2 has a branch point 4 at which two flow passages 3a and 3b will branch off on its way and a junction point 5 at which the branched two flow passages 3a and 3b will join before the cooling medium outlet 7, Namely, the cooling medium flow passage 2 will branch off at the branch point 4 which is provided between the cooling medium inlet 6 and the cooling medium outlet 7 and flow into two flow passages 3a and 3b. Then, the two flow passages 3a and 3b will join at the junction point 5 which is provided between the branch point 4 and the cooling medium outlet 7. By the branch of the cooling medium flow passage 2, a flow rate of the cooling medium is controlled so that the conductance can be controlled in consideration of widths and depths of the branched flow passages 3a and 3b, the length of the path to the junction point 5, and numbers of bending. Therefore, even if one inlet 6 and one outlet 7 are provided, different cooling abilities of the cooling medium flow passage 2 can be provided.

Further, since cooling medium introduced into the backing plate 1 circulates while absorbing a heat from the backing plate 1, the temperature of the cooling medium becomes the lowest at the cooling medium inlet 6 and becomes the highest at the cooling medium outlet 7. According to the embodiment, the cooling medium inlet 6 of the cooling medium flow passage 2 having four channels are respectively placed in the vicinity of locations corresponding to the four corner portions of the target 10. Consequently, the four corner portions of the target 10 having the highest sputtering power density, namely having the highest temperature, can be cooled effectively, thereby the uniform temperature distribution of the target 10 is ensured.

Further, first, cooling medium introduced from the cooling medium inlet 6 flows along a line 10a, which is one side of the rectangular target 10, makes a turn, and then branches off at the branch point 4, separately flowing through the branched two flow passages 3a and 3b. The cooling medium flowing through one flow passage 3a flows along a line 10b, which is another side of the target 10 orthogonal to the line 10a. Thereafter, the cooling medium makes a turn and flows along in parallel with the line 10a and then, at the junction point 5, will join with the cooling medium which flows through another flow passage 3b. The cooling medium flowing through another flow passage 3b snakes in parallel direction with the line 10b and join with the cooling medium which flows one flow passage 3a, at the junction point 5. The cooling medium, which joined at the junction point 5, flows out of the backing plate 1 via the cooling medium outlet 7. In this way, cooling medium flows along one line 10a and another line 10b orthogonal to the line 10a. Accordingly, the portion in the vicinity of the two lines forming one corner of the target 10, can be cooled.

Further, according to the embodiment, the cooling medium flow passage 2 having four channels is formed and cooling medium flows through each channel of the cooling medium flow passage 2, so that it is possible to cool the portion in the vicinity of four sides of the target 10, namely, the peripheral portion of the target 10. Consequently, the peripheral portion of the target 10 having higher sputtering power density than that of the central portion of the target 10, namely having higher temperature than that of the central portion, can be cooled effectively, thereby a uniform temperature distribution of the target 10 is ensured.

Figure 4A:
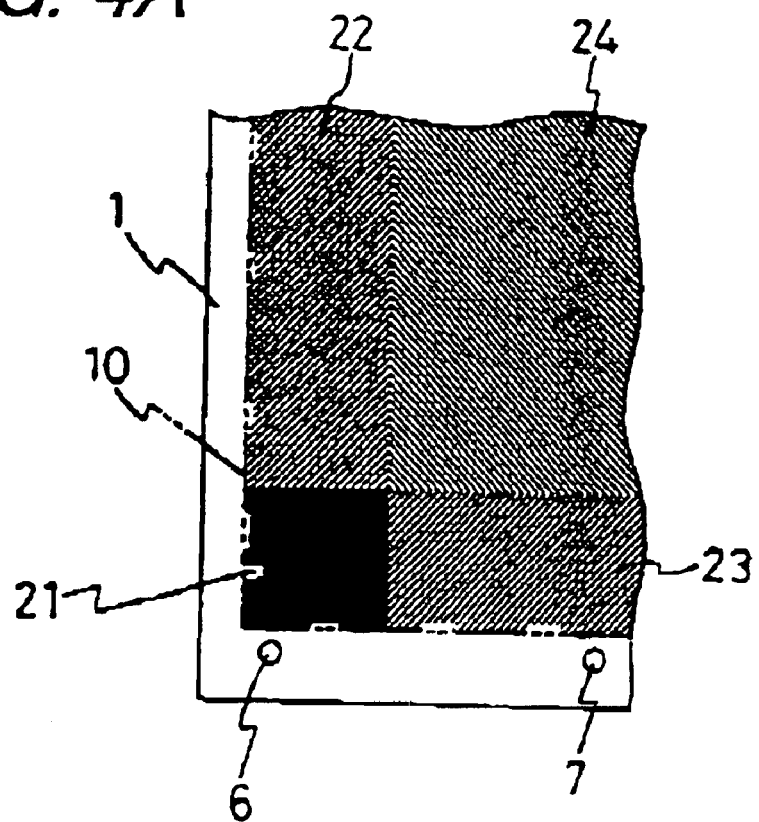
FIGS. 4A and 4B are schematic views showing a state where a sputtering power is applied to a target surface using the backing plate of the invention.
Figure 4B:
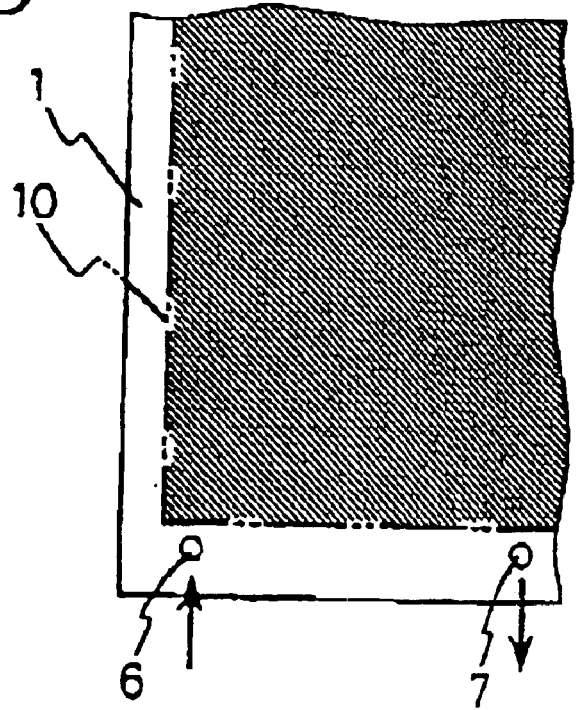

FIGS. 4A and 4B are schematic views showing a state where a sputtering power is applied to the target surface using the backing plate 1 of the invention. In FIG. 4A, oblique lines indicate a current distribution, and in FIG. 4B, oblique lines indicate a temperature distribution. As shown in FIG. 4A, in order to obtain the uniform film thickness of the thin film to be formed on the substrate, the different sputtering powers are applied to a region which comes in contact with the target 10. More specifically, higher sputtering power than that of a target central portion 24 is applied to periphery portions 22 and 23. Moreover, higher sputtering power than that of the periphery portions 22 and 23 is applied to a corner portion 21.

The cooling abilities of the backing plate 1 differs as different electric powers required for sputtering are applied in the target surface. Namely, the backing plate 1 can cool the peripheral portions 22 and 23 better than the central portion of the target 24, and cool the corner portion 21 better than the peripheral portions 22 and 23, Consequently, as shown in FIG. 4B, the temperature unevenness is eliminated at cooling, so that it is possible to obtain the uniform temperature distribution of the entire surface of the target and a bonding surface between the target 10 and the backing plate 1. Accordingly, peeling and melting of the target 10 due to temperature rise can be prevented, thereby the sputtering power which can be applied to the target 10 is increased. Then, film deposition rate can be accelerated by increasing the sputtering power, so that the productivity of the substrate can be improved.

In particular, in the case of forming a thin film on a large substrate as mentioned above, when the different sputtering powers are applied so as to form a thin film having the uniform film thickness and uniform film quality, cooling medium flowing through the cooling medium flow passage 2 cools the target 10 effectively in accordance with the temperature distribution caused by the different sputtering powers. Consequently, the entire surface of the target can be cooled uniformly.

Figure 5:
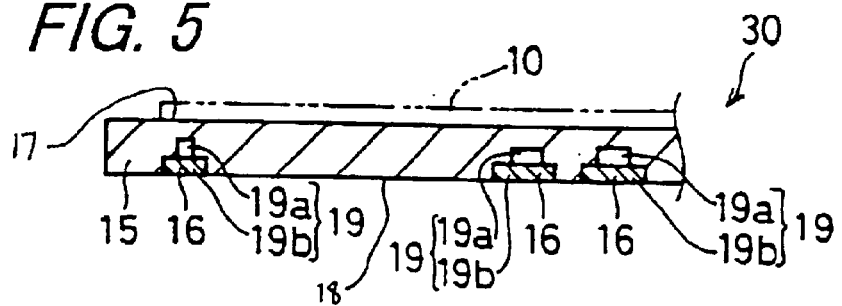
FIG. 5 is a cross sectional view showing a backing plate according to another embodiment of the invention.
Figure 6A:
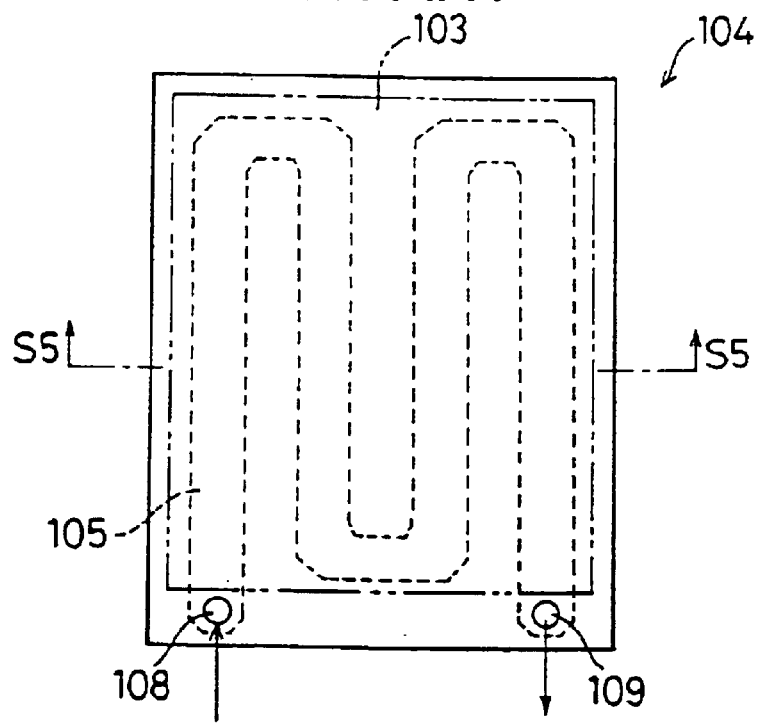
FIGS. 6A and 6B are views showing a conventional backing plate.
Figure 6B:
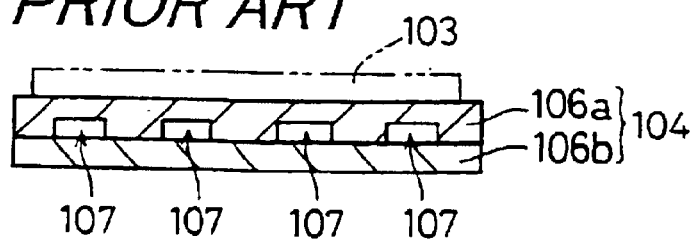

FIG. 5 is a cross sectional view of a backing plate 30 according to another embodiment of the invention. The backing plate 30 has much the same configuration as that of the backing plate 1 as shown in FIG. 1, FIGS. 3A and 3B except for the configuration for forming the cooling medium flow passage 2. The same reference numerals are denoted for the same configuration and description will be omitted. The backing plate 30 has a planar cooling medium flow passage formation plate 15 and a planar sealing body 16. The target 10 is bonded to one surface 17 of the cooling medium flow passage formation plate 15 in a thickness direction and grooves 19 are formed open toward a side of another surface 18 of the cooling medium flow passage formation plate 15 in the thickness direction.

The groove 19 is formed in a shape of step having difference in width at a bottom side and at a surface side. Namely, a space 19a having narrow width at the bottom side is formed in conjunction with a space 19b having wider width than the space 19a at the surface side via a step. In order to cover the narrow space 19a, the sealing body 16 is fitted into the wide space 19b. The space formed by three surfaces forming the narrow space 19a and a surface of the sealing plate 16 facing the narrow space, is defined as the cooling medium flow passage 2. Cooling medium flows through the cooling medium flow passage 2. In this way, by forming the cooling medium flow passage 2, it is possible to reduce welding portions.

Moreover, the above mentioned embodiment is only example of the invention, and the configuration can be altered within the scope of the invention. For example, the cooling medium flow passage 2 should be designed in consideration of a minimum of symmetry in the shape and in generation source of heat source, or local singularity regarding the configuration of the target 10 and the film deposition chamber 41 of the sputtering apparatus 40. Therefore, the cooling medium flow passage 2 does not necessarily require four channels. By further reducing the number of channels in the cooling medium flow passage 2, operation can be easily carried out and numbers of processes can be reduced when a target change operation is carried out.

Further, according to the embodiment, one cooling medium flow passage 2 branches off two flow passages 3a and 3b at the branch point 4. The embodiment is not limited to this, but the cooling medium flow passage 2 may branch off two or more flow passages. In the same way, a number of the junction point 5 is not limited to one. In addition, such a design may be adopted that it is possible to cool so as to uniform the temperature distribution in the surface of the target in consideration of the distribution of sputtering power density to be applied to the target surface.

Then, as means for controlling the conductance of branched cooling medium flow passage 2, the height of flow passages 3a and 3b may be varied, namely, the depth of the grooves 13 may be controlled, instead of the means described in the embodiment. Also, as cooling medium, another liquid and fluid such as gas may be used, instead of water.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. A backing plate which is used for a sputtering apparatus for forming a thin film on a substrate, and to which a substantially rectangularly-shaped target is bonded, the backing plate comprising:

cooling means for feeding a cooling medium to the backing plate at a predetermined flow rate, the cooling means including at least one cooling medium flow passage, and wherein there is substantially uniform temperature distribution in the target by virtue of:

(a) controlling the flow rate of the cooling medium;

(b) feeding the cooling medium to at least one corner of the backing plate and to at least a portion of the periphery of the backing plate such that a different level of cooling is achieved at the at least one corner than at the at least a portion of the periphery; and (c) applying different sputtering powers to predetermined portions of the target, and wherein the substantially uniform temperature distribution in the target results in formation of a thin film having a substantially uniform film thickness.

2. The backing plate of claim 1, wherein the level of cooling is higher at the at least one corner than at the at least a portion of the periphery.

3. The backing plate of claim 2, wherein the backing plate is formed by electron beam welding of a member having a groove as a cooling medium flow passage and a member for covering the grooves.

4. The backing plate of claim 2, wherein the backing plate is formed by laser beam welding of a member having a groove as a cooling medium flow passage and a member for covering the grooves.

5. The backing plate of claim 1, wherein a higher sputtering power than that applied to a central portion of the target is applied to four corner portions of the target.

6. The backing plate of claim 5, wherein an inlet for at least one cooling medium flow passage is provided at a position in the backing plate corresponding to at least one of the four corner portions of the target.

7. A sputtering method for forming a thin film on a substrate using a target, the method comprising the steps of:

applying different sputtering powers to portions of the target; and cooling the target via a cooling means that includes at least one cooling medium flow passage for feeding a cooling medium to at least one corner of a backing plate and to at least a portion of the periphery of the backing plate such that a different level of cooling is achieved at the at least one corner than at the at least a portion of the periphery, and wherein the method is effective to ensure a substantially uniform temperature distribution by eliminating temperature unevenness in a surface of the target, the uniform temperature distribution enabling formation of a thin film having a substantially uniform film thickness.

* * * * *